United States Patent
Chang-Chien et al.

(10) Patent No.: US 7,662,669 B2
(45) Date of Patent: Feb. 16, 2010

(54) METHOD OF EXPOSING CIRCUIT LATERAL INTERCONNECT CONTACTS BY WAFER SAW

(75) Inventors: Patty Pei-Ling Chang-Chien, Redondo Beach, CA (US); Kelly Jill Tornquist Hennig, Torrance, CA (US); Ken Wai-Kin Ho, Alhambra, CA (US); Ann Kent-Ming Ho, Temple City, CA (US)

(73) Assignee: Northrop Grumman Space & Mission Systems Corp., Los Angeles, CA (US)

( * ) Notice: Subject to any disclaimer, the term of this patent is extended or adjusted under 35 U.S.C. 154(b) by 191 days.

(21) Appl. No.: 11/782,488

(22) Filed: Jul. 24, 2007

(65) Prior Publication Data

US 2009/0029526 A1    Jan. 29, 2009

(51) Int. Cl.
*H01L 21/00*    (2006.01)
(52) U.S. Cl. .................................... 438/113; 438/107
(58) Field of Classification Search .................. 438/51, 438/107, 113
See application file for complete search history.

(56) References Cited

U.S. PATENT DOCUMENTS

| | | |
|---|---|---|
| 5,266,528 A | 11/1993 | Yamada |
| 5,369,060 A | 11/1994 | Baumann et al. |
| 5,393,706 A | 2/1995 | Mignardi et al. |
| 5,739,048 A | 4/1998 | Kerth et al. |
| 5,923,958 A | 7/1999 | Chou |
| 5,965,933 A | 10/1999 | Young et al. |
| 6,114,191 A | 9/2000 | Young et al. |
| 6,271,102 B1 | 8/2001 | Brouillette et al. |
| 6,281,047 B1 | 8/2001 | Wu et al. |
| 6,436,793 B1 | 8/2002 | Kneezel et al. |
| 6,562,647 B2 | 5/2003 | Zandman et al. |
| 6,607,970 B1 | 8/2003 | Wakabayashi |
| 6,661,080 B1 | 12/2003 | Glenn et al. |
| 6,686,291 B1 | 2/2004 | Hortaleza |
| 6,800,508 B2 | 10/2004 | Kimura |
| 6,830,956 B2 | 12/2004 | Masumoto et al. |
| 6,849,523 B2 | 2/2005 | Chao et al. |
| 6,869,861 B1 | 3/2005 | Glenn et al. |
| 6,887,771 B2 | 5/2005 | Kobayashi |
| 6,955,976 B2 | 10/2005 | Hartwell et al. |
| 7,001,828 B2 | 2/2006 | Barzen et al. |
| 7,033,914 B2 | 4/2006 | Yee |

(Continued)

FOREIGN PATENT DOCUMENTS

JP    60042846    3/1985

*Primary Examiner*—Bradley K Smith
(74) *Attorney, Agent, or Firm*—John A. Miller; Miller IP Group, PLC

(57) ABSTRACT

A method for fabricating wafer-level packages including lateral interconnects. The method includes precutting a cover wafer at the locations where the cover wafer will be completely cut through to separate the wafer-level packages. The cover wafer is bonded to the substrate wafer using bonding rings so as to seal the integrated circuit within a cavity between the cover wafer and the substrate wafer, where the precuts face the substrate wafer. The cover wafer is then cut at the precut locations to remove the unwanted portions of the cover wafer between the packages and expose contacts or probe pads for the lateral interconnects. The substrate wafer is then cut between the wafer-level packages to separate the packages.

17 Claims, 3 Drawing Sheets

U.S. PATENT DOCUMENTS

| | | |
|---|---|---|
| 7,042,105 B2 | 5/2006 | Hartwell et al. |
| 7,125,747 B2 | 10/2006 | Lee et al. |
| 7,183,622 B2 * | 2/2007 | Heck et al. .................. 257/528 |
| 2003/0213953 A1 * | 11/2003 | Sohn et al. .................... 257/48 |
| 2004/0075967 A1 * | 4/2004 | Lynch et al. ................ 361/277 |
| 2004/0166654 A1 | 8/2004 | Matsuda et al. |
| 2005/0059188 A1 | 3/2005 | Bolken et al. |
| 2005/0176166 A1 * | 8/2005 | Chen et al. .................... 438/51 |
| 2005/0255627 A1 | 11/2005 | Omori |
| 2006/0003549 A1 * | 1/2006 | Wood et al. ................. 438/455 |
| 2006/0057776 A1 | 3/2006 | Tao |
| 2006/0128064 A1 | 6/2006 | Chen et al. |
| 2006/0228831 A1 | 10/2006 | Nasiri et al. |
| 2006/0237810 A1 | 10/2006 | Sand et al. |
| 2007/0004087 A1 | 1/2007 | Kao et al. |

* cited by examiner

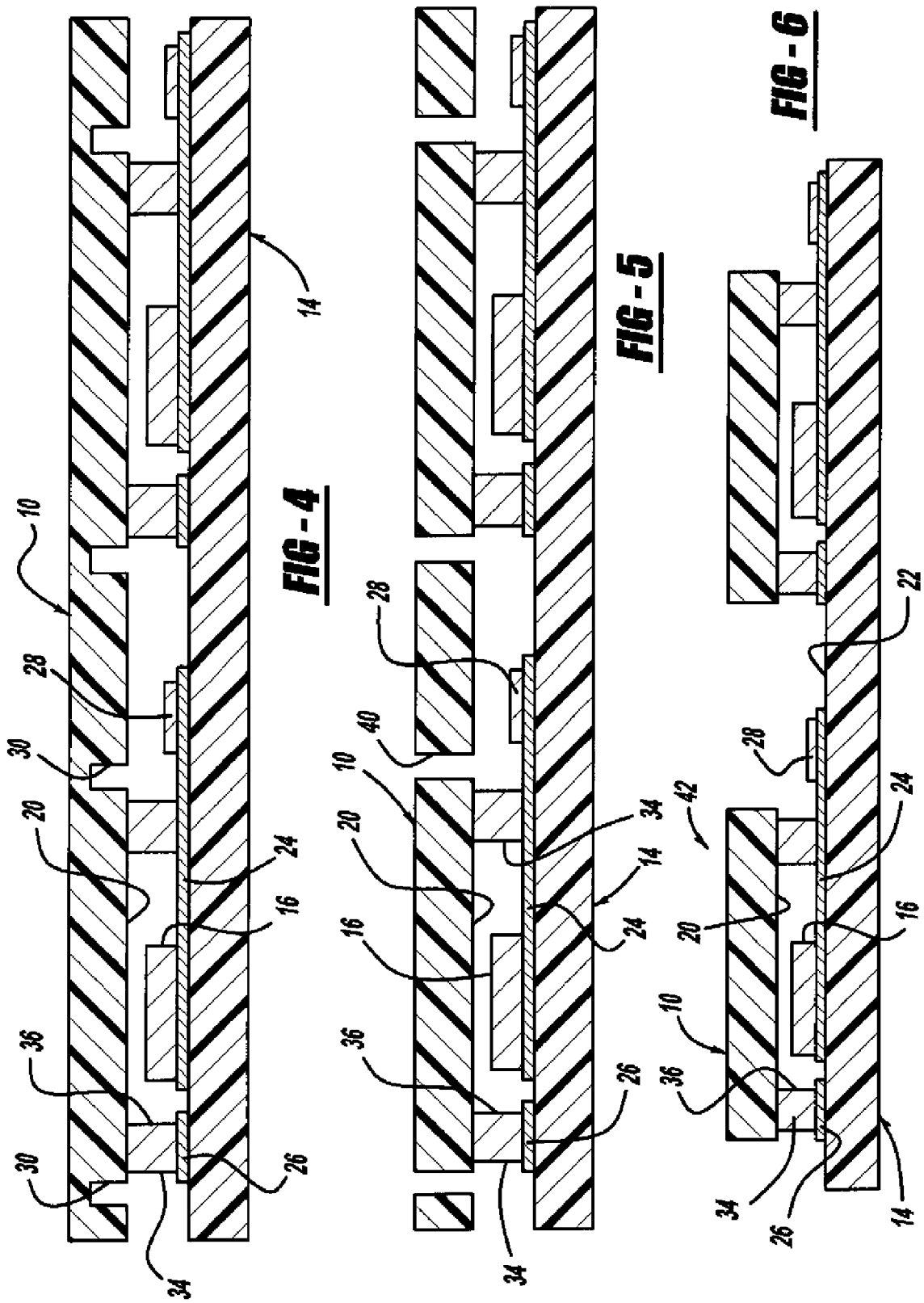

METHOD OF EXPOSING CIRCUIT LATERAL INTERCONNECT CONTACTS BY WAFER SAW

GOVERNMENT CLAUSE

This invention was made with Government support under F33615-02-C-1185 awarded by the United States Air Force. The Government has certain rights in this invention.

BACKGROUND OF THE INVENTION

1. Field of the Invention

This invention relates generally to a method for separating wafer-level packages from a wafer and, more particularly, to a method for separating wafer-level packages that use lateral interconnects from a wafer that includes precutting a cover wafer between the wafer-level packages before the cover wafer is mounted to a substrate wafer on which integrated circuits are provided.

2. Discussion of the Related Art

It is known in the art to provide wafer-level packages for integrated circuits, such as monolithic millimeter-wave integrated circuits (MMIC), formed on a substrate wafer. In one wafer-level package design, a cover wafer is mounted to the substrate wafer using a bonding ring so as to provide a hermetically sealed cavity in which one or more integrated circuits are provided. Typically, many integrated circuits are formed on a substrate wafer and covered by a single cover wafer as a batch integration, where each integrated circuit is surrounded by a separate bonding ring. The cover wafer and substrate are then diced between the bonding rings to separate the packages for each integrated circuit. The dicing process typically uses a wafer saw that cuts the cover wafer between the packages where a portion of the cover wafer may be removed. The substrate wafer is then cut between the packages.

For these types of wafer-level packages, interconnects to the integrated circuit within the cavity are typically made in two ways. In a first technique, vertical vias are provided through the cover wafer for a connection to electrical signal traces within the cavity. In a second technique, a lateral interconnect is provided where signal and ground traces extend through the bonding ring and are accessible laterally from the integrated circuit outside of the package. Lateral interconnects are traditionally very difficult to implement using wafer-scale assembly and bonding methods because contact pads for the circuits are relatively inaccessible. Further, the cover wafer is very thin. Therefore, when dicing the cover wafer between the packages, the saw blade sometimes cuts through the lateral interconnects severing the connection.

Probe pads are generally provided on the lateral interconnect for testing and probing purposes to allow the integrated circuits to be tested at the wafer level. Thus, the probe pad needs to be exposed to allow access thereto. For lateral interconnects, this requires that a portion of the cover wafer between the packages be removed. In an alternate process, deep reactive ion etching (DRIE) or dry etching methods can be employed to etch the substrates so the probe pad is exposed. However, such an etching process is typically complex because etching through the substrates is material dependent, where a different chemistry is required, and the process is typically very slow and costly. Further, proper protection to the etching chemicals or gas may need to be implemented to protect the probe pads and the thin-film layers beneath. Also, depending on the substrate material and thickness, dry etching may be impractical or impossible. For example, quartz substrates cannot be etched easily with a dry etch, and is almost impossible to etch quartz substrates greater than 300 µm with a dry etch.

SUMMARY OF THE INVENTION

In accordance with the teachings of the present invention, a method for fabricating wafer-level packages including lateral interconnects is disclosed. The method includes precutting a cover wafer at the locations where the cover wafer will be completely cut through to separate the wafer-level packages. The cover wafer is bonded to the substrate wafer using bonding rings so as to seal the integrated circuit within a cavity between the cover wafer and the substrate wafer, where the precuts face the substrate wafer. The cover wafer is then cut at the precut locations to remove the unwanted portions of the cover wafer between the packages and expose contacts or probe pads on the lateral interconnects. The substrate wafer is then cut between the wafer-level packages to separate the packages.

Additional features of the present invention will become apparent from the following description and appended claims, taken in conjunction with the accompanying drawings.

BRIEF DESCRIPTION OF THE DRAWINGS

FIG. 4 is a cross-sectional view of the cover wafer bonded to the substrate wafer and defining the wafer-level packages;

FIG. 5 is a cross-sectional view of the bonded cover wafer and substrate wafer shown in FIG. 4 with the cover wafer cut completely through;

FIG. 6 is a cross-sectional view of the cut portions of the cover wafer removed;

DETAILED DESCRIPTION OF THE EMBODIMENTS

The following discussion of the embodiments of the invention directed to a method for providing wafer-level packages having lateral interconnects using cover wafer precuts is merely exemplary in nature, and is in no way intended to limit the invention or its applications or uses.

Figure 1:
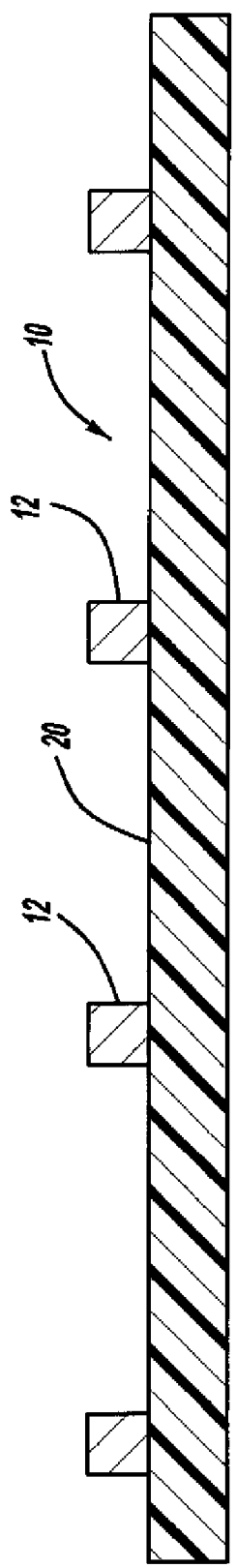
FIG. 1 is a cross-sectional view of a cover wafer for wafer-level packaging.

FIG. 1 is a cross-sectional view of a cover wafer 10 that will be part of wafer-level packages for integrated circuits. The cover wafer 10 can be made of any suitable material for a particular application, such as silicon, glass, III-V compound semiconductors, etc. Further, the cover wafer 10 can have any suitable thickness for a particular application, such as 100 µm. A plurality of rings 12 are fabricated on a surface 20 of the cover wafer 10 for reasons that will become apparent from the discussion below. In one embodiment, the rings 12 include a gold (Au) layer and a bonding layer.

Figure 2:
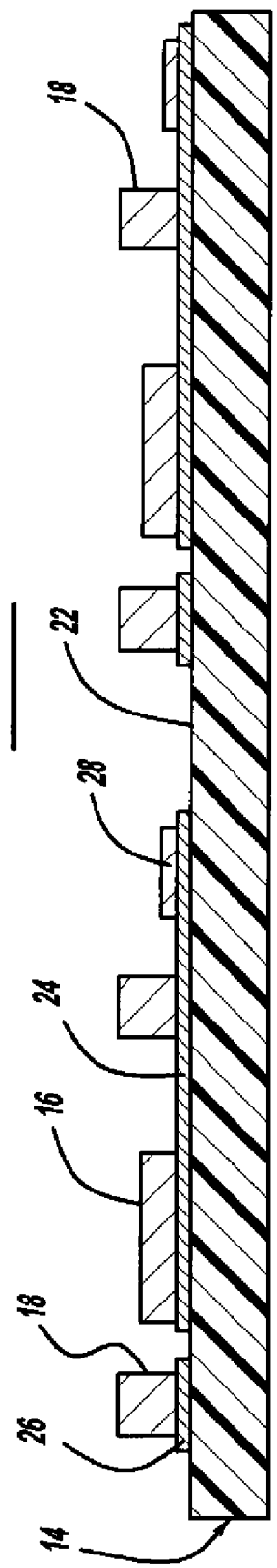
FIG. 2 is a cross-sectional view of a substrate wafer that includes integrated circuits for wafer-level packaging.

FIG. 2 is a cross-sectional view of a substrate wafer 14 on which integrated circuits 16 are formed by any suitable integrated circuit fabrication process. The substrate wafer 14 can be any suitable substrate wafer for wafer-level packaging of the type discussed herein, such as silicon, group III-V semiconductors, etc. The integrated circuits 16 are intended to represent any suitable number of circuits for any suitable component or device, such as an MMIC. A ring 18 is formed around each integrated circuit 16, and can also be a gold (Au) ring having a bonding layer. A desired configuration of signal traces, microstrip lines, coplanar waveguides, etc. are fabricated on a top surface 22 of the substrate wafer 14 to provide signal contact and ground contact to the integrated circuit 16, as is well understood in the art. These various signal and ground plane interconnects are represented as layer 24. The layer 24 represents a lateral interconnect to the integrated circuit 16 of the type discussed above, where the layer 24 extends under the ring 20. A contact or probe pad 28 is fabricated on the layer 24 outside of the ring 18. A layer 26 is also provided between the substrate wafer 14 and the ring 18, and is deposited with the layer 24.

Two wafer-level packages for enclosing the integrated circuits 16 are shown in FIGS. 1 and 2. Of course, in a real application, many such wafer-level packages will be fabricated on a common substrate wafer.

Figure 3:
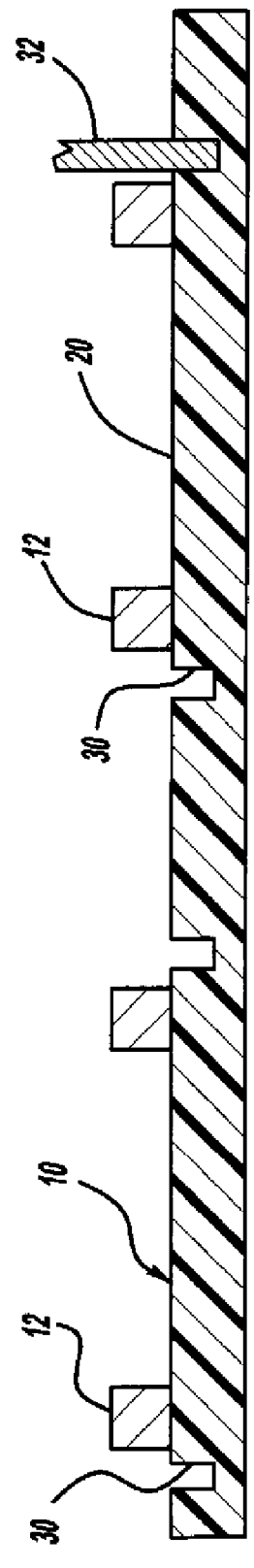
FIG. 3 is a cross-sectional view of the cover wafer shown in FIG. 1 including precuts.

Once the various wafer-level packages have been formed, it is necessary to separate the packages from the wafer by dicing or sawing between the packages. According to the invention, a series of precuts 30 are provided through the surface 20 and partially through the cover wafer 10 before the cover wafer 10 is bonded to the substrate wafer 14. FIG. 3 is a cross-sectional view of the cover wafer 10 showing the precuts 30 formed outside of the rings 12. The precuts 30 are made by a wafer saw including a saw blade 32 to a desired depth. In this non-limiting embodiment, the precuts 30 are provided about half-way through the cover wafer 10 so that the cover wafer 10 can still be handled as a single unit without loss of integrity. The precuts 30 provide saw depth control in a practical manner to avoid damage to the lateral interconnect layer 24 after the cover wafer 10 is bonded to the substrate wafer 14, as will become more apparent from the discussion below.

Next, the cover wafer 10 is bonded to the substrate wafer 14, as shown in FIG. 4. Particularly, the rings 12 are aligned with the rings 18, and a suitable low-temperature bonding process is used so that the bonding layer on the bonding rings 12 and 18 join to provide a bonding ring 34 that defines a cavity 36 in which the integrated circuits 16 are hermetically sealed. In one non-limiting embodiment, the cavity 36 has a height in the range of 5 µm-100 µm. By providing the precuts 30 through the surface of the cover wafer 10 that includes the rings 12, the precuts 30 now face the substrate wafer 14 allowing the second saw cut to be significantly removed from the lateral interconnect layer 24

Once the cover wafer 10 is bonded to the substrate wafer 14, a second cut 40 by a suitable wafer saw is provided through the cover wafer 10 directly opposite to the precuts 30 to begin the process of separating the wafer-level packages from each other. Because the precuts 30 are provided in the cover wafer 10, the depth of the second cut 40 through the cover wafer 14 does not need to extend completely through the cover wafer 10, and thus, the saw blade 32 will not be in jeopardy of contacting and damaging the lateral interconnect layer 24.

Figure 7:
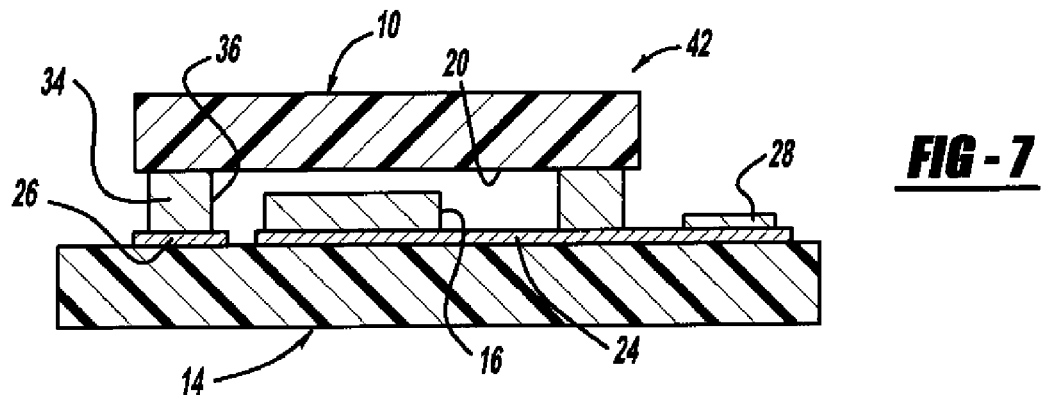
FIG. 7 is a cross-sectional view of a separated wafer-level package.

FIG. 6 is a cross-sectional view of the substrate wafer 14 showing the removed portions of the cover wafer 10 between the now defined wafer-level packages 42. As is apparent, the pads 28 are now readily accessible to provide test probing, and other things. Next, the substrate wafer 14 is diced between the wafer-level packages 42 so as to separate them. A cross-sectional view of one of the wafer-level packages 42 is shown in FIG. 7.

By providing a metal bonding ring and lateral feedthroughs, maintaining a low-loss 50-ohm interconnection requires special RF design. The bonding ring 34 is grounded so that the feedthrough trace is an inverted microstrip with a very thin silicon nitride dielectric.

Figure 8:
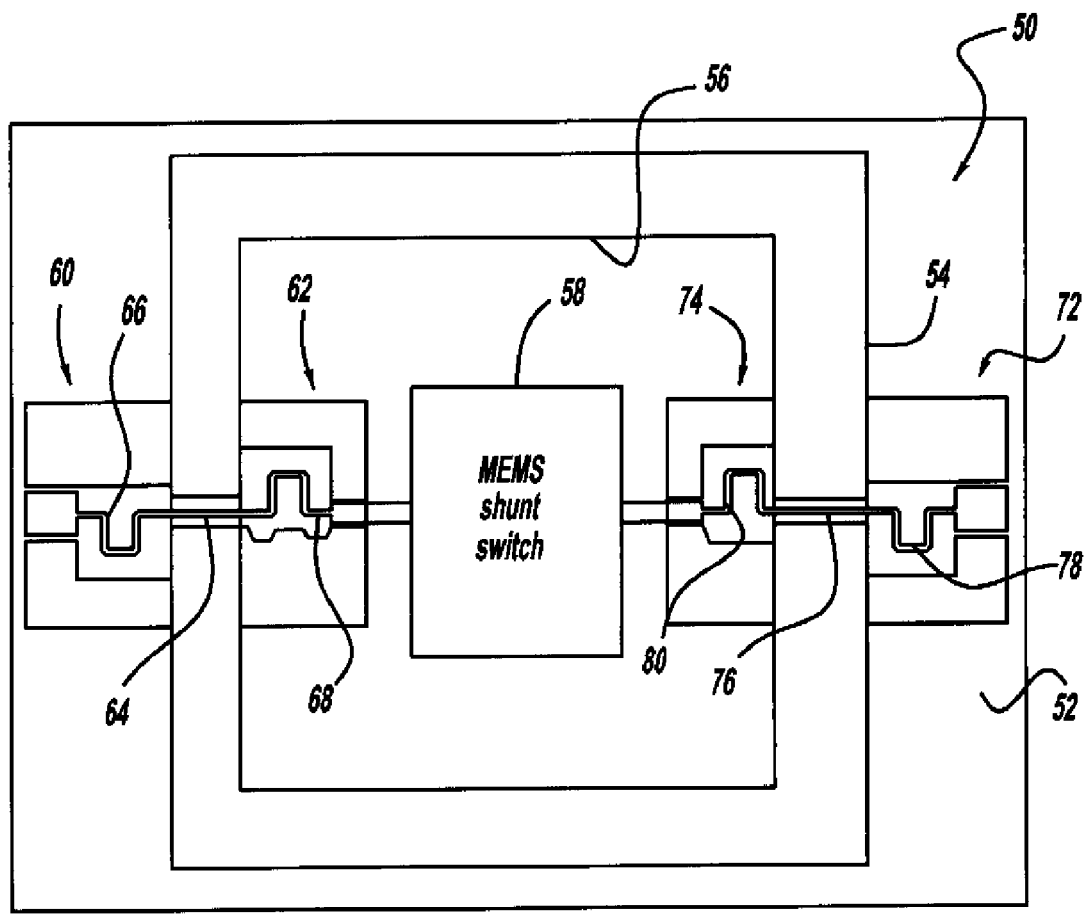
FIG. 8 is a top view of a wafer-level package including an MEMS switch electrically coupled to input and output coplanar waveguides using lateral interconnects.

FIG. 8 is a top plan view of an integrated circuit wafer-level package 50 including a substrate wafer 52, where the cover wafer has been removed for clarity. A metal bonding ring 54 is provided on a substrate 52 to provide a hermetically sealed cavity 56. In this embodiment, the wafer-level package 50 is an enclosure for a micro-electromechanical switch (MEMS) 58. An input coplanar waveguide (CPW) 60 is provided on the substrate 52 outside of the ring 54, and is electrically coupled to a CPW 62 within the cavity 56 by an inverted microstrip line 64 provided under or through the ring 54. The microstrip line 64 is positioned relative to the ring 54 to provide a ground plane. The CPW 60 includes a high Z meandering line 66 and the CPW 62 includes a high Z meandering line 68 electrically coupled to the microstrip line 64 for impedance matching purposes. Likewise, a CPW 72 is provided on the substrate 52 outside of the ring 54 and opposite to the MEMS 58, and is electrically coupled to a CPW 74 within the cavity 56 by an inverted microstrip line 76 provided under or through the ring 54. The CPW 72 includes a high Z meandering line 78 and the CPW 74 includes a high Z meandering line 80 electrically coupled to the microstrip line 76 for impedance matching purposes.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method for fabricating wafer-level packages comprising:

providing a cover wafer including a first surface and a second surface;

depositing a plurality of cover wafer rings on the first surface of the cover wafer;

precutting the cover wafer through the first surface and partially through the cover wafer so as to provide precuts at a plurality of predetermined locations;

providing a substrate wafer;

fabricating a plurality of integrated circuits on the substrate wafer;

depositing a substrate wafer ring around one or more integrated circuits on the substrate wafer;

providing a lateral interconnect from one or more integrated circuits through its associated substrate wafer ring;

bonding the substrate wafer rings to the cover wafer rings to provide bonding rings that define cavities between the cover wafer and the substrate wafer in which the integrated circuits are provided;

cutting the cover wafer through the second surface of the cover wafer at the locations where the precuts are provided so as to remove portions of the cover wafer between adjacent precuts and between the bonding rings and exposing the lateral interconnects where the lateral interconnects are laterally spaced from the cuts; and cutting the substrate wafer between the bonding rings and laterally adjacent to the lateral interconnects so as to separate wafer-level packages.

2. The method according to claim 1 wherein precutting the cover wafer includes precutting the cover wafer about half-way through the cover wafer.

3. The method according to claim 1 wherein depositing a plurality of cover wafer rings and depositing a substrate wafer ring around each integrated circuit include depositing rings having a gold layer and an indium layer where the indium layers are joined together to form the bonding ring.

4. The method according to claim 1 wherein providing a cover wafer includes providing a cover wafer about 100 μm thick.

5. The method according to claim 1 wherein fabricating a plurality of integrated circuits includes fabricating a plurality of integrated circuits including a micro-electromechanical switch.

6. The method according to claim 1 wherein providing a lateral interconnect includes providing a coplanar waveguide.

7. The method according to claim 1 wherein providing a lateral interconnect includes providing a microstrip line.

8. The method according to claim 7 where the microstrip line is an inverted microstrip line extending under a metal bonding ring.

9. The method according to claim 1 wherein precutting the cover wafer, cutting the cover wafer and cutting the substrate include using a wafer saw blade.

10. The method according to claim 1 wherein cutting the cover wafer through the second surface of the cover wafer includes cutting the cover wafer through the second surface of the cover wafer so that the cutting device does not extend completely through the cover wafer.

11. A method for fabricating a wafer-level package comprising:
  providing a cover wafer including a first surface and a second surface;
  precutting the cover wafer at a plurality of predetermined locations through the first surface and partially through the cover wafer so as to provide precuts;
  providing a substrate wafer including a plurality of integrated circuits;
  bonding the cover wafer to the substrate wafer so that the precuts face the substrate wafer; and
  cutting the cover wafer through the second surface of the cover wafer at the locations where the precuts are provided so as to remove portions of the cover wafer between adjacent precuts.

12. The method according to claim 11 wherein cutting the cover wafer through the second surface of the cover wafer includes cutting the cover wafer through the second surface of the cover wafer so that the cutting device does not extend completely through the cover wafer.

13. The method according to claim 11 wherein precutting the cover wafer includes precutting the cover wafer about half-way through the cover wafer.

14. The method according to claim 11 wherein precutting the cover wafer includes using a wafer saw blade.

15. The method according to claim 11 further comprising providing a lateral interconnect formed on the substrate wafer and extending through a bonding ring.

16. A method for fabricating a wafer-level package comprising:
  providing a cover wafer including a first surface and a second surface;
  precutting the cover wafer using a wafer saw through the first surface and partially through the cover wafer so as to provide precuts;
  providing a substrate wafer including a plurality of integrated circuits;
  providing lateral interconnects electrically coupled to the integrated circuits and extending through a bonding ring;
  bonding the cover wafer to the substrate wafer using the bonding ring so that the precuts face the substrate wafer;
  cutting the cover wafer through the second surface of the cover wafer at the locations where the precuts are provided so as to remove portions of the cover wafer between adjacent precuts and between bonding rings and exposing the lateral interconnects where the lateral interconnects are laterally spaced from the cuts; and
  cutting the substrate wafer between the bonding rings and laterally adjacent to the lateral interconnects so as to separate wafer-level packages.

17. The method according to claim 16 wherein precutting the cover wafer includes precutting the cover wafer about half-way through the cover wafer.

\* \* \* \* \*